United States Patent [19]

Ladany et al.

[11] 3,959,522
[45] May 25, 1976

[54] METHOD FOR FORMING AN OHMIC CONTACT

[75] Inventors: Ivan Ladany, Stockton; Donald Paul Marinelli, Trenton, both of N.J.

[73] Assignee: RCA Corporation, New York, N.Y.

[22] Filed: Apr. 30, 1975

[21] Appl. No.: 573,387

[52] U.S. Cl. .................... 427/89; 357/67; 357/71; 427/91; 427/125; 427/380; 427/383
[51] Int. Cl.² .......................... B05D 5/12
[58] Field of Search ............ 427/89, 124, 125, 91, 427/380, 383; 357/67, 71

[56] References Cited
UNITED STATES PATENTS

| | | | |
|---|---|---|---|
| 3,349,476 | 10/1967 | Pilkuhn et al. | 427/89 |
| 3,636,618 | 1/1972 | Herzog et al. | 357/67 |
| 3,821,785 | 6/1974 | Rose | 357/71 |
| 3,850,688 | 11/1974 | Halt | 357/67 |

*Primary Examiner*—Cameron K. Weiffenbach
*Attorney, Agent, or Firm*—Glenn H. Bruestle; Daniel N. Calder; George E. Haas

[57] ABSTRACT

Gold is deposited onto a heated surface of N type semiconductor material composed of either gallium arsenide, gallium phosphide, aluminum gallium arsenide or aluminum gallium phosphide. The surface of the gallium compound is cooled to room temperature whereupon tin is deposited onto the gold. The semiconductor material is then reheated until the tin alloys with and through the gold into the material. A solderable surface may be applied to the semiconductor material by applying a film nickel and then a film of gold onto the alloyed surface.

6 Claims, 3 Drawing Figures

METHOD FOR FORMING AN OHMIC CONTACT

BACKGROUND OF THE INVENTION

This invention relates to ohmic contacts using tin and more particularly to ohmic contacts on N type gallium arsenide, gallium phosphide, aluminum gallium arsenide or aluminum gallium phosphide.

One of the major drawbacks in forming a tin type ohmic contact on N type gallium arsenide, aluminum gallium arsenide, gallium phosphide and aluminum gallium phosphide is that the tin tends to ball up on the semiconductor surface when heat is applied to drive the tin into the semiconductor material. This drawback is particularly evident in gallium arsenide and aluminum gallium arsenide electroluminescent devices where a uniform current distribution is desired. The tin has a high surface tension and a low wetting ability on gallium arsenide, gallium phosphide, aluminum gallium arsenide and aluminum gallium phosphide which prevents the formation of a uniform film and as a result prevents the formation of a good uniform electrical contact. The current flows from the ohmic contact into the device only through the balls of tin and therefore through only a small portion of the surface of the semiconductor material.

It is well known that ohmic contacts can be formed of various alloys. Included among these are alloys of tin and gold. However, the prior art does not teach a method of alloying gold and tin on these semiconductor materials in a manner which avoids the balling up on the surface.

SUMMARY OF THE INVENTION

A tin ohmic contact may be formed on N type semiconductor material composed of either gallium arsenide, gallium phosphide, aluminum gallium arsenide or aluminum gallium phosphide by initially depositing a thin layer of gold onto the heated semiconductor material. The semiconductor material is cooled and a layer of tin is deposited onto the gold layer. The semiconductor material is then reheated until the tin alloys into the gold and through it into the material. By the careful controlling of the temperature at which the tin and gold are deposited and alloyed, the balling up of the tin on the surface of the semiconductor material has been eliminated.

DETAILED DESCRIPTION OF THE INVENTION

Figure 1:
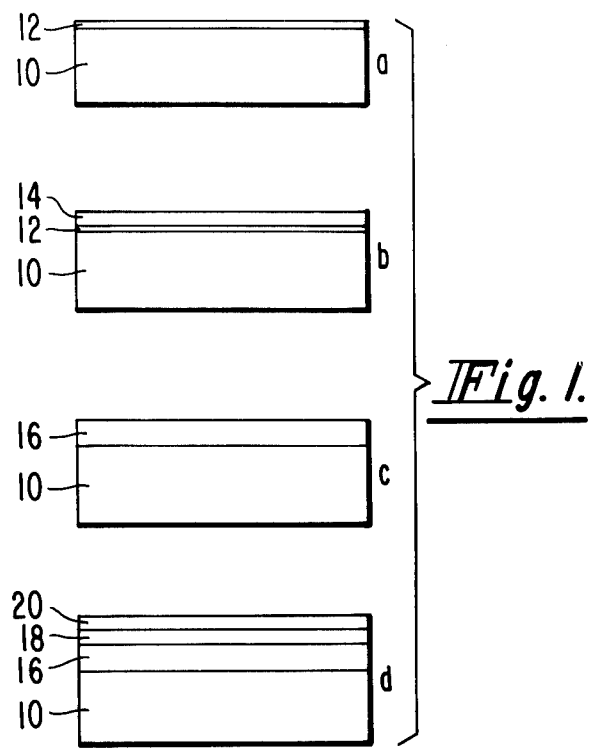
FIG. 1 shows a step-by-step process for making an ohmic contact by the present invention.

As illustrated in FIG. 1, an ohmic contact is formed on a body 10 of N type semiconductor material composed of either gallium arsenide, aluminum gallium arsenide, gallium phosphide or aluminum gallium phosphide. The body 10 is initially heated to a temperature at which gold will alloy with the semiconductor material, about 350° to 400° C for gallium arsenide. A thin first layer 12 of gold about 500 A thick is deposited upon one surface of the body 10 as shown in FIG. 1 (a). Next the layered body 10 is cooled to about room temperature. With reference to FIG. 1 (b), a second layer 14 of tin is deposited upon the first layer 12. The second layer 14 is approximately 500 A to 1000 A thick. The first and second layers 12 and 14 may be deposited by evaporation, sputtering or similar techniques.

The body 10 is then heated until the tin alloys into and through the gold into the semiconductor material. In the case of gallium arsenide, the material is heated to about 400° C in a forming gas environment of 10% hydrogen and 90% nitrogen. The exact temperature and length of heating in the furnace may be determined by viewing the surface of the body 10 through a microscope. The alloying is complete when a phase change in the surface is observed. Alternately, when the second layer 14 is deposited by evaporation, the heating may be accomplished under a vacuum in the evaporator. When the body is formed of gallium arsenide, it is heated to about 400° C for 10 seconds. This forms an alloyed layer 16 on the body 10 as shown in FIG. 1 (c).

By depositing the gold onto the heated semiconductor body, then depositing the tin onto the cooled body and next alloying the two layers into the semiconductor material, the wetability of the gold and the tin on gallium arsenide, gallium phosphide, aluminum gallium arsenide and aluminum gallium phosphide is much higher than tin alone or gold and tin alloyed by previous techniques. The tin in the present method uniformly alloys itself to the gold layer and penetrates that layer into the semiconductor material. This forms a uniform contact with the semiconductor material and the problem of tin balling up on the surface is eliminated. This uniform contact provides for an even current flow into the semiconductor material rather than the spotty flow with a balled up ohmic contact. By merely depositing a gold layer and a tin layer and then alloying the two into the semiconductor material without the temperature difference during the deposition, the balling up of the tin on the surface is not eliminated.

As shown in FIG. 1 (d) additional layers may be added to the ohmic contact to provide a solderable surface. A third layer 18 of nickel may be deposited on the alloyed layer 16. Gold then may be deposited on the nickel layer 18 to form an outer contact layer 20.

Figure 2:
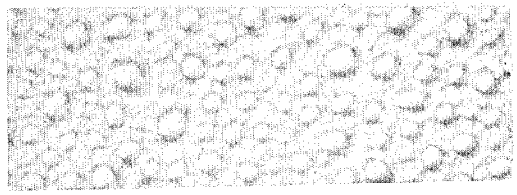
FIG. 2 is a micro-photograph of a prior art ohmic contact where tin is applied to the surface of semiconductor material.
Figure 3:
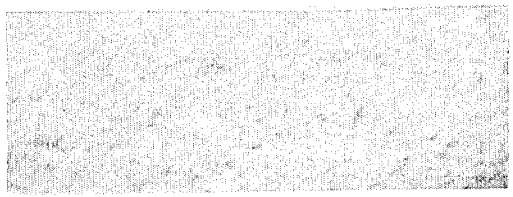
FIG. 3 is a micro-photograph of an ohmic contact formed on semiconductor material by the present method.

As shown in FIG. 2 when the first and second layers are deposited on a body of gallium arsenide by conventional techniques, the tin balls up on the surface of the semiconductor material. The subsequent layers also take on this balled configuration forming an ohmic contact on the body of gallium arsemide only where the tin balls are located. However, when the layers are deposited by the present method a uniformly smooth ohmic contact is formed, as shown in FIG. 3.

We claim:

1. A method for forming an ohmic contact to N-type semiconductor material selected from the group consisting of gallium arsenide, aluminum gallium arsenide, gallium phosphide, and aluminum gallium phosphide, said method comprising the steps of:
    depositing a thin layer of gold onto heated semiconductor material;
    cooling the semiconductor material;
    depositing a layer of tin onto the gold layer; and
    reheating the semiconductor material until the tin alloys into and through the gold into the semiconductor material.

2. The method as in claim 1 including the steps of:

depositing a nickel layer onto the alloyed surface of the semiconductor material; and depositing a layer of gold onto the nickel layer.

3. The method as in claim 1 wherein the semiconductor material is cooled to about room temperature during the cooling step.

4. The method as in claim 1 wherein the layers of gold and tin are deposited by evaporation techniques.

5. The method as in claim 4 wherein when gallium arsenide is selected as the semiconductor material, the gallium arsenide is heated to between 350° to 400° C during the deposition of the layer of gold.

6. The method as in claim 5 wherein during the reheating step the semiconductor material is heated to about 400°C.

* * * * *